United States Patent
Tsuzukihashi et al.

(10) Patent No.: US 9,388,507 B2
(45) Date of Patent: Jul. 12, 2016

(54) METHOD FOR MANUFACTURING POLYCRYSTALLINE SILICON INGOT, AND POLYCRYSTALLINE SILICON INGOT

(75) Inventors: Koji Tsuzukihashi, Akita (JP); Hiroshi Ikeda, Akita (JP); Masahiro Kanai, Akita (JP); Saburo Wakita, Noda (JP)

(73) Assignees: MITSUBISHI MATERIALS CORPORATION, Tokyo (JP); MITSUBISHI MATERIALS ELECTRONIC CHEMICALS CO., LTD., Akita-Shi (JP)

( * ) Notice: Subject to any disclaimer, the term of this patent is extended or adjusted under 35 U.S.C. 154(b) by 791 days.

(21) Appl. No.: 13/637,054

(22) PCT Filed: Mar. 25, 2011

(86) PCT No.: PCT/JP2011/057361
§ 371 (c)(1),
(2), (4) Date: Sep. 25, 2012

(87) PCT Pub. No.: WO2011/118773
PCT Pub. Date: Sep. 29, 2011

(65) Prior Publication Data
US 2013/0008371 A1    Jan. 10, 2013

(30) Foreign Application Priority Data

Mar. 26, 2010    (JP) ................. 2010-071700

(51) Int. Cl.
*C30B 11/00* (2006.01)
*C01B 33/021* (2006.01)
*C30B 29/06* (2006.01)

(52) U.S. Cl.
CPC .............. *C30B 11/00* (2013.01); *C01B 33/021* (2013.01); *C30B 11/002* (2013.01); *C30B 11/003* (2013.01); *C30B 29/06* (2013.01)

(58) Field of Classification Search
CPC combination set(s) only.
See application file for complete search history.

(56) References Cited

U.S. PATENT DOCUMENTS

2006/0144326 A1    7/2006    Einhaus et al.
2008/0196656 A1*   8/2008    Rancoule ............ 117/206
2009/0297425 A1   12/2009    Tsuzukihashi et al.

FOREIGN PATENT DOCUMENTS

| CN | 101213328 A | 7/2008 |
| CN | 101506097 A | 8/2009 |
| JP | 10-245216 A | 9/1998 |

(Continued)

OTHER PUBLICATIONS

Machine trasnlation of JP2004-196577 pulled May 3, 2015.*
(Continued)

*Primary Examiner* — Duy Deo
*Assistant Examiner* — Erin Bergner
(74) *Attorney, Agent, or Firm* — Leason Ellis LLP

(57) ABSTRACT

A method for manufacturing a polycrystalline silicon ingot includes unidirectionally solidifying a molten silicon upwardly from the bottom of a crucible, wherein the crucible is provided with silica deposited on the bottom of the crucible; and then dividing the degree of solidification in the crucible into a first zone from 0 mm to X in height (10 mm≤X<30 mm), a second zone from X to Y in height (30 mm≤Y<100 mm) and a third zone of Y or more in height, based on the bottom of the crucible, wherein a solidification rate V1 in the first zone is set in the range of 10 mm/h≤V1≤20 mm/h and a solidification rate V2 in the second zone is set in the range of 1 mm/h≤V2≤5 mm/h.

8 Claims, 7 Drawing Sheets

(56) References Cited

FOREIGN PATENT DOCUMENTS

| JP | 2001-198648 A | 7/2001 |
| JP | 2004-196577 A | 7/2004 |
| JP | 2006-273628 A | 10/2006 |
| JP | 2006-526751 A | 11/2006 |

OTHER PUBLICATIONS

Noritaka Usami et al., Modification of Local Structures in Multicrystals Revealed by Spatially Resolved X-ray Rocking Curve Analysis, *Journal of Applied Physics*, 2007, pp. 103504-1-103504-4, vol. 102, No. 103504.

International Search Report mailed Jun. 28, 2011 for the corresponding PCT Application No. PCT/JP2010/057355.

International Search Report mailed Jun. 28, 2011 for the corresponding PCT Application No. PCT/JP2011/057361.

Nagashio et al, "Growth mechanism of twin-related and twin-free facet Si dendrites", *Acta Materialia*, Elsevier, Jun. 1, 2005, vol. 53, pp. 3,021 to 3,029.

Office Action mailed Mar. 10, 2014 for the related Chinese Application No. 201180015881.9.

Office Action mailed May 27, 2014 for the corresponding Japanese Application No. 2010-071700.

\* cited by examiner

METHOD FOR MANUFACTURING POLYCRYSTALLINE SILICON INGOT, AND POLYCRYSTALLINE SILICON INGOT

CROSS-REFERENCE TO RELATED PATENT APPLICATIONS

This application is a U.S. National Phase Application under 35 U.S.C. §371 of International Patent Application No. PCT/JP2011/057361, filed Mar. 25, 2011, and claims the benefit of Japanese Patent Application No. 2010-071700, filed Mar. 26, 2010, all of which are incorporated by reference herein. The International Application was published in Japanese on Sep. 29, 2011 as International Publication No. WO/2011/118773 under PCT Article 21(2).

FIELD OF THE INVENTION

The present invention is related to a method for manufacturing a polycrystalline silicon ingot by unidirectionally solidifying a silicon melt in a silica crucible to cast the polycrystalline silicon ingot, and the polycrystalline silicon ingot obtained by the method.

BACKGROUND OF THE INVENTION

A polycrystalline silicon ingot has been used as a material for a solar cell substrate, for example, as disclosed in Patent Document 1. Namely, the polycrystalline silicon ingot is cut into slices having a predetermined thickness to make a polycrystalline silicon wafer, and then the polycrystalline silicon wafer is processed to produce a solar cell substrate. Performances of the solar cells, such as conversion efficiency may depend a great deal on characteristics of the polycrystalline silicon ingot, that is, the material for the solar cell substrate (polycrystalline silicon wafer).

In particular, higher amount of oxygen and impurities in the polycrystalline silicon may lead to a significant decrease in the conversion efficiency of the solar cell. Thus, it is necessary to reduce the amount of oxygen and impurities in the polycrystalline silicon which acts as the solar cell substrate to maintain the conversion efficiency of the solar cell in a high level.

The polycrystalline silicon ingot unidirectionally solidified in a crucible, which is obtained by sequential solidification in a predetermined direction, tends to have increased amounts of oxygen and impurities both at the bottom, a starting point of solidification, and the top, an end of solidification. Thus, both the bottom and the top of the polycrystalline silicon ingot unidirectionally solidified should be cut off and removed to reduce the amount of oxygen and impurities.

The reasons why the amount of oxygen and impurities increase at the bottom and the top of the polycrystalline silicon ingot will be described in more detail below.

When a silicon melt is unidirectionally solidified in the crucible upwardly, the impurities migrate from a solid phase to a liquid phase in the silicon melt because the impurities are less soluble in the solid phase than in the liquid phase. While this results in a decreased amount of impurities in the solid phase, it leads to a significantly increased amount of impurities at the top of the polycrystalline silicon ingot, i.e., at the end of solidification.

When the silicon melt is left in a silica crucible, oxygen is incorporated into the silicon melt from silica constituting the crucible. Oxygen incorporated in the silicon melt is released as SiO gas from the liquid level of the silicon melt. At the beginning of solidifying, oxygen is incorporated into the silicon melt from the bottom and a side wall of the crucible to increase the oxygen content in the silicon melt, resulting in a higher oxygen content at the bottom which is the starting point of solidification. As the solid-liquid interface moves up with progression of solidification from the bottom, oxygen becomes incorporated only from the side wall, and therefore, there is a gradual decrease in the oxygen content incorporated into the silicon melt. That is why the oxygen content is higher at the bottom which is the starting point of solidification.

So, in the past, for example, as disclosed in Patent Document 2, there has been provided various techniques for controlling incorporation of oxygen by using a silica crucible with a $Si_3N_4$ coating layer formed on the inside (the side wall and the bottom) thereof.

Further, when unidirectionally solidifying the polycrystalline silicon ingot, as disclosed in Non Patent Document 1, it has been designed to set a constant solidification rate of, for example, 0.2 mm/min (12 mm/h) to improve its production efficiency.

CITATION LIST

Patent Document

Patent Document 1:
  Japanese Unexamined Patent Application, First Publication No. Hei 10-245216
Patent Document 2:
  Japanese Unexamined Patent Application, First Publication No. 2001-198648

Non Patent Document

Non Patent Document 1:
  Noriaki Usami, Kentaro Kutsukake, Kozo Fujiwara and Kazuo Nakajima; "Modification of local structures in multicrystals revealed by spatially resolved x-ray rocking curve analysis", JOURNAL OF APPLIED PHYSICS, 102, 103504 (2007).

TECHNICAL PROBLEM

It has been known that conversion efficiency of the solar cells are significantly affected by not only the amount of oxygen and the amount of impurities in the polycrystalline silicon used as the solar cell substrate but also crystal quality of the polycrystalline silicon. The polycrystalline silicon ingot grown by the unidirectional solidification technique is an aggregate of column crystals extended in a height direction of the ingot. In a cross-section perpendicular to the solidification direction, more the percentage of crystals facing to preferred crystal orientation (001) and/or (111) are, the conversion efficiency of the solar cells are improved.

As disclosed in Patent Document 2 and Non Patent Document 1, when the crucible with the $Si_3N_4$ coating layer formed thereon is used, the $Si_3N_4$ coating layer does not get chemically wet with the silicon melt, or the silicon melt has less wettability with the $Si_3N_4$ coating layer, so that a crystal nucleus which means a starting point of solidification does not tend to occur. This consequently decreases the number of crystal nucleus. Then, since the crystal started to grow at the beginning of solidification continues to grow, the crystal grown in the direction other than the preferred crystal orientation (001) and/or (111) remains as it is. In particular, this tends to occur predominantly in the lower part below the center of the polycrystalline silicon ingot. As a result, when using the crucible with the $Si_3N_4$ coating layer formed thereon, the solar cell produced using the substrate made of the lower part of the polycrystalline silicon ingot has tended to have a lower conversion efficiency.

In other words, in the conventional method for manufacturing a polycrystalline silicon ingot, the use of the crucible with the $Si_3N_4$ coating layer formed thereon to reduce the oxygen content has led to random crystal orientation and therefore failed in improvement of the conversion efficiency of the solar cells.

In contrast, when the crucible with no $Si_3N_4$ coating layer formed thereon to readily create the crystal nucleus, it has failed in an uncontrollable oxygen incorporation and led to an increased oxygen content in the polycrystalline silicon ingot, and after all, it has been impossible to improve the conversion efficiency of the solar cells.

Thus, in the conventional method for manufacturing a polycrystalline silicon ingot, it has been impossible to achieve both of a decrease in the oxygen content and control of crystal orientation, Recently, the solar cells are required to further improve in the conversion efficiency. Thus, there is a need to provide a polycrystalline silicon having a lower oxygen content than the conventional polycrystalline silicon (specifically, an oxygen content of $4 \times 10^{17}$ atm/cm$^3$ or less).

The conventional method for manufacturing the polycrystalline silicon ingot makes it possible to control oxygen incorporation into the silicon melt even when the crucible with the $Si_3N_4$ coating layer formed thereon is used, but not to completely prevent it. Thus, as described above, the amount of oxygen tends to increase at the bottom side corresponding to the starting point of solidification. When an upper limit of the oxygen content in polycrystalline silicon as a finished product is turned to its lower setting vale, it is necessary to excessively cut off and remove the bottom side of the polycrystalline silicon ingot to meet the setting value. In this context, there has been a problem that results in a decreased amount of the polycrystalline silicon product made from each polycrystalline silicon ingot to dramatically reduce the production efficiency of polycrystalline silicon.

The present invention has been made in the light of the above circumstances, and an object thereof is to provide a method for manufacturing a polycrystalline silicon ingot, which is possible to cast the polycrystalline silicon ingot of which the production yield as the finished product may be significantly improved by increasing crystals facing in the (001) and/or (111) direction(s), the preferred growth orientation, and decreasing in portion having the higher oxygen content at the bottom of the polycrystalline silicon ingot; and the polycrystalline silicon ingot.

SUMMARY OF THE INVENTION

Solution to Problem

A method for manufacturing a polycrystalline silicon ingot according to a first aspect of the present invention is a method for manufacturing a polycrystalline silicon ingot, which includes:

providing a crucible which is made of silica and which is provided with a silicon nitride coating layer formed on its side wall (inside) and silica deposited on its bottom; and unidirectionally solidifying a molten silicon in the crucible upwardly from the bottom of the crucible, wherein a degree of solidification is divided in the crucible into a first zone from 0 mm to X in height, a second zone from X to Y in height and a third zone of Y or more in height, based on the bottom of the crucible, the height X falls in the range of 10 mm$\leq$X<30 mm and the height Y falls in the range of 30 mm$\leq$Y<100 mm, and a solidification rate V1 in the first zone is set in the range of 10 mm/h$\leq$V1$\leq$20 mm/h and a solidification rate V2 in the second zone is set in the range of 1 mm/h$\leq$V2$\leq$5 mm/h, In the method for manufacturing the polycrystalline silicon ingot with such a constitution, the degree of solidification in the crucible is divided into a first zone from 0 mm to X in height, a second zone from X to Y in height and a third zone of Y or more in height, based on the bottom of the crucible, to define each solidification rate in the first and second zones, respectively.

The crucible is made of silica and has a silicon nitride coating layer formed on its side wall (inside) and the silica deposited on its bottom so that the silica is exposed at the bottom of the crucible to be a starting point of solidification. Since the silica gets chemically wet with the silicon melt, that is, the silicon melt shows a higher wettability for the silica, this tends to create a crystal nuclei, thereby, the crystal nuclei leads to the onset of formation of a number of fine crystals at the early stage of solidification. The fine crystals are oriented at random. In the first aspect of the present invention, a solidification rate V1 in the first zone is set in the range of 10 mm/h$\leq$V1$\leq$20 mm/h to relatively slow it so that it permits a lot of group crystals with random crystal orientation to occur in the first zone.

When a solidification rate V2 in the second zone is set in the range of 1 mm/h$\leq$V2$\leq$5 mm/h to relatively slow it, it leads to a selective growth of a crystal facing to a given orientation from the group crystals with random crystal orientation so that a crystal facing to the preferred growth orientation may be grown predominantly. Thereby, this makes it possible to cast the polycrystalline silicon ingot made of a large column crystal with unidirectional crystal orientation. Herein, since the preferred growth orientation of silicon is the (001) and/or (111) direction(s), the column crystal may be designed to face the preferred growth orientation to improve the conversion efficiency of the solar cells.

Further, the solidification rate V1 in the first zone is set in the range of 10 mm/h$\leq$V1$\leq$20 mm/h to relatively increase the rate to rapidly form a solid phase at the bottom of the crucible, and thereby, oxygen incorporation into the silicon melt from the bottom of the crucible may be controlled. In addition, the height X in the first zone may be set in the range of 10 mm$\leq$X<30 mm to ensure the control of oxygen incorporation into the silicon melt from the bottom of the crucible.

Moreover, the solidification rate V2 in the second zone may be set in the range of 1 mm/h$\leq$V2$\leq$5 mm/h to relatively slow it to release oxygen contained in the silicon melt from its liquid level in the second zone, thereby, this may result in a significant decrease in the oxygen content in the silicon melt. It may also ensure to selectively grow the crystal facing to a given orientation, as mentioned above.

Each height Y in the first and second zones may be set in the range of 30 mm$\leq$Y$\leq$100 mm, respectively, to shorten the length of the portion having the higher oxygen content and the length of the area in which the crystal are oriented in random, thereby, the production yield referring to the finished product polycrystalline silicon may be significantly improved.

However, when the solidification rate V1 is less than 10 mm/h, it may result in inadequate crystalline nucleation to fail to create so many crystal groups with random crystal orientation. Conversely, when the solidification rate V1 is more than 20 mm/h, it may fail to reduce the height X in the first zone.

Therefore, the solidification rate V1 in the first zone would be set in the range of 10$\leq$V1$\leq$20 mm/h.

Further, when the solidification rate in the second zone V2 is less than 1 mm/h, it may cause remelting of the solid phase.

When the solidification rate V2 is more than 5 mm/h, it may not sufficiently cause the selective growth of the crystals facing to a given orientation and release of oxygen. Therefore, the solidification rate V2 in the second zone would be set in the range of 1 mm/h≤V2≤5 mm/h.

The height Y–X in the second zone is preferably set in the range of 10 mm≤Y–X>40 mm.

In this case, since the height Y–X in the second zone is set in the range of Y–X≥10 mm, this may take enough time to grow the crystals having orientation selectivity and to release oxygen in the silicon melt externally so that the crystal facing to the preferred growth orientation may be selectively grown, and it may reliably decrease the oxygen content in the polycrystalline silicon ingot. In contrast, since the height Y–X in the second zone is set in the range of Y–X ≤40 mm, this may reliably decrease in portion having the higher oxygen content and the area wherein the crystal faces to the random crystal orientation.

A solidification rate V3 in the third zone is preferably set in the range of 5 mm/h≤V3≤30 mm/h.

Herein, the solidification rate V3 in the third zone may be set in the range of V3≥5 mm/h to maintain the production efficiency of the polycrystalline silicon ingot in a high level. In contrast, the solidification rate V3 in the third zone may be set in the range of V3≤30 mm/h to facilitate the unidirectionally solidification smoothly.

On the bottom (inside) of the crucible, a multilayered silica coating layer including a slurry layer and a stucco layer laminated to each other is preferably formed.

Herein, the multilayered silica coating layer may be formed on the inside of the bottom of the crucible by depositing the slurry layer made by coating a silica-containing slurry and the stucco layer stuccoed (dusted) with grain silica thereon on top of each other to prevent the bottom of the polycrystalline silicon ingot from cracking. Further, the slurry layer and the stucco layer may be preferably formed to be 3 layers or more and 4 layers or less in total to make sure to achieve the above advantageous effect, The polycrystalline silicon ingot according to the second aspect of the present invention is a polycrystalline silicon ingot made by the above-mentioned method for manufacturing a polycrystalline silicon ingot, wherein crystal growth orientation in a horizontal cross-section of a portion which is located 40 mm above its bottom portion in contact with the bottom of the crucible is measured by an EBSD method to determine distribution of crystal orientation within a stereographic triangle of which apexes are at (100), (101) and (111); and then the stereographic triangle is divided into three regions: a region on the side (100), a region on the side (101) and a region on the side (111), along lines connecting each of center points between apexes to a gravity point of the stereographic triangle to obtain distribution of crystal orientation included in each region represented by a relative intensity ratio from the corresponding electron diffraction pattern, resulting in 10% or less of the percentage found in a region on the side of (101).

In the polycrystalline silicon ingot having the components, the distribution of crystal orientation is represented by a relative intensity ratio from the electron diffraction patterns measured in a portion which is located 40 mm above its bottom portion in contact with the bottom of the crucible, resulting in 10% or less of the percentage of the crystal growth orientation found in the region on the side of (101) within the stereographic triangle, and the percentages both in the region on the side of (001) and the region on the part (111) are increased, and thereby, the selective growth of the crystals having a given orientation has been believed to be sufficiently proceeded in a portion which is located 40 mm above its bottom portion in contact with the bottom of the crucible. Accordingly, even when using the zone as the solar cell substrate, it may result in significantly improved conversion efficiency of the solar cell.

Also, in the polycrystalline silicon ingot according to the second aspect of the present invention, the concentration of oxygen in the center of the cross-section of a portion which is located 30 mm above its bottom portion in contact with the bottom of the crucible may be set to $4 \times 10^{17}$ atm/cm$^3$ or less.

In the polycrystalline silicon ingot having the components, the oxygen content in the center of the cross-section of a portion which is located 30 mm above its bottom portion in contact with the bottom of the crucible may be set to $4 \times 10^{17}$ atm/cm$^3$ or less to adequately make a finished product using a portion which is located 30 mm above its bottom portion.

ADVANTAGEOUS EFFECTS OF THE INVENTION

Thus, according to the present invention, the method for manufacturing a polycrystalline silicon ingot, which is allowed to cast the polycrystalline silicon ingot by decreasing in portion having the higher oxygen content at its bottom and the significantly improved production yield of the polycrystalline silicon finished product, and the polycrystalline silicon ingot may be provided.

DETAILED DESCRIPTION OF THE INVENTION

BEST MODE FOR CARRYING OUT THE INVENTION

The method for manufacturing a polycrystalline silicon ingot and the polycrystalline silicon ingot according to an embodiment of the present invention will be described below with reference to the accompanying drawings.

The polycrystalline silicon ingot 1 according to the embodiment of the present invention serves as a material for polycrystalline silicon wafer to be used as the solar cell substrate.

Figure 1:
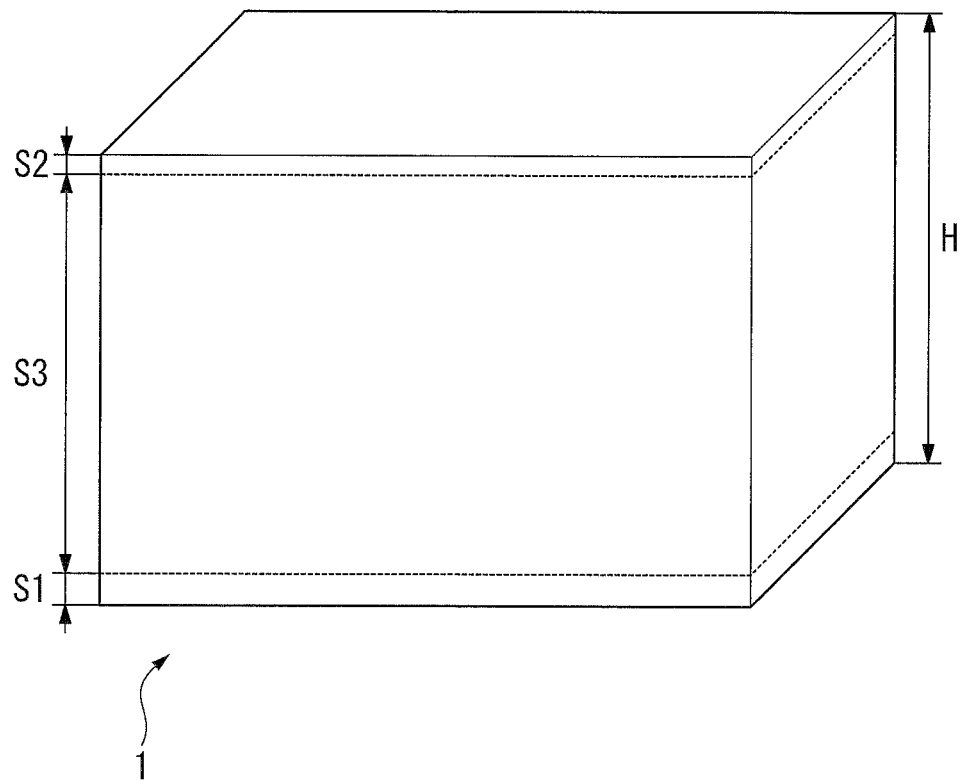
FIG. 1 is a schematic view illustrating a polycrystalline silicon ingot according to an embodiment of the present invention.

The polycrystalline silicon ingot 1 of the present embodiment has the shape of a quadrangular prism as shown in FIG. 1, the height H of which is set in the range of 200 mm≤H≤350 mm. More specifically, in the present embodiment, the height H of the polycrystalline silicon ingot 1 is set to 300 mm. Additionally, the bottom in the form of a quadrangle is assumed to be a square, approximately 680 mm on a side.

The bottom side of the polycrystalline silicon ingot 1, S1, has a higher oxygen content, and at the top portion S2 of the polycrystalline silicon ingot 1 has a higher content of impurities. Thus, a polycrystalline silicon wafer finished product may be made of only a product portion S3 of the polycrystalline silicon ingot 1 remaining after cutting off and removing both of the bottom side S1 and top portion S2.

Figure 2:
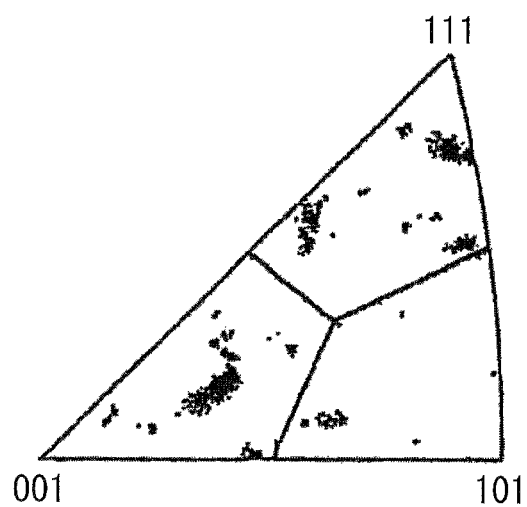
FIG. 2 is a schematic view illustrating the results of measurements of crystal growth orientation by an EBSD method in the horizontal cross-section of a portion which is located 40 mm above a bottom portion of the polycrystalline silicon ingot shown in FIG. 1, presented in a stereographic triangle.

As shown in FIG. 2, the crystal growth orientation in a horizontal cross-section of a portion which is located 40 mm above the bottom portion of the polycrystalline silicon ingot 1 is measured by an EBSD method. More specifically, the distribution of crystal orientation within a stereographic triangle of which apexes are at (001), (101) and (111) is measured in the EBSD method, and then the stereographic triangle is divided into three regions along the lines connecting each of center points between apexes to the gravity point of the stereographic triangle to define each of the regions with apexes at (001), (101) and (111) as a region on the side of (001), a region on the side of (101) and a region on the side of (111), respectively. The distribution of crystal orientation comprised in each region is represented by a relative intensity ratio from the corresponding electron diffraction pattern to find 10% or less of the percentage of the distribution of crystal orientation distributed in the region on the side of (101). That is, there are also more crystals facing to the crystal orientation distributed both in the region on the side of (001) and the region on the side of (111).

In addition, the polycrystalline silicon ingot 1 is configured to have $4\times10^{17}$ atm/cm$^3$ or less of the oxygen content in the center of the cross-section of a portion which is located 30 mm above a bottom portion. In the present embodiment, a test sample in size of 5 mm×5 mm×5 mm is taken from the center of the cross-section to determine the oxygen content using the infrared point spectrometer (IPS).

Figure 3:
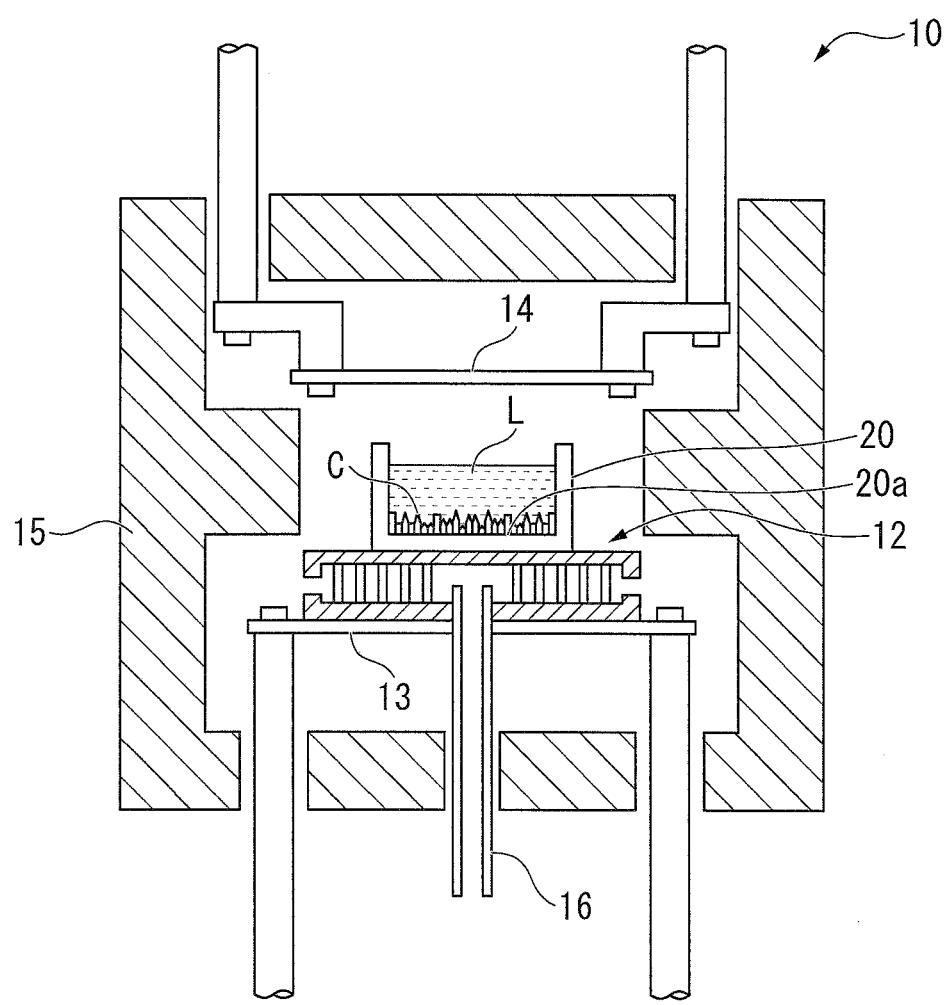
FIG. 3 is a schematic view illustrating a polycrystalline silicon ingot manufacturing apparatus, which is used to produce the polycrystalline silicon ingot shown in FIG. 1.

Then, a polycrystalline silicon ingot manufacturing apparatus 10 used in the production of the polycrystalline silicon ingot 1 will be described below with reference to FIG. 3.

The polycrystalline silicon ingot manufacturing apparatus 10 includes a crucible 20 in which the silicon melt L is stored; a chill plate 12 to mount the crucible 20; an underfloor heater 13 to support the chill plate 12 from below; and a ceiling heater 14 laying above the crucible 20. The crucible 20 is surrounded by a thermal insulating material 15.

The chill plate 12 is formed into a hollow structure, into which Ar gas is supplied through a feed pipe 16.

The crucible 20 is assumed to have the shape of a quadrangular (square) or a round (circle) in its horizontal cross-section, but in the present embodiment, it a quadrangular (square) shape.

Figure 4:
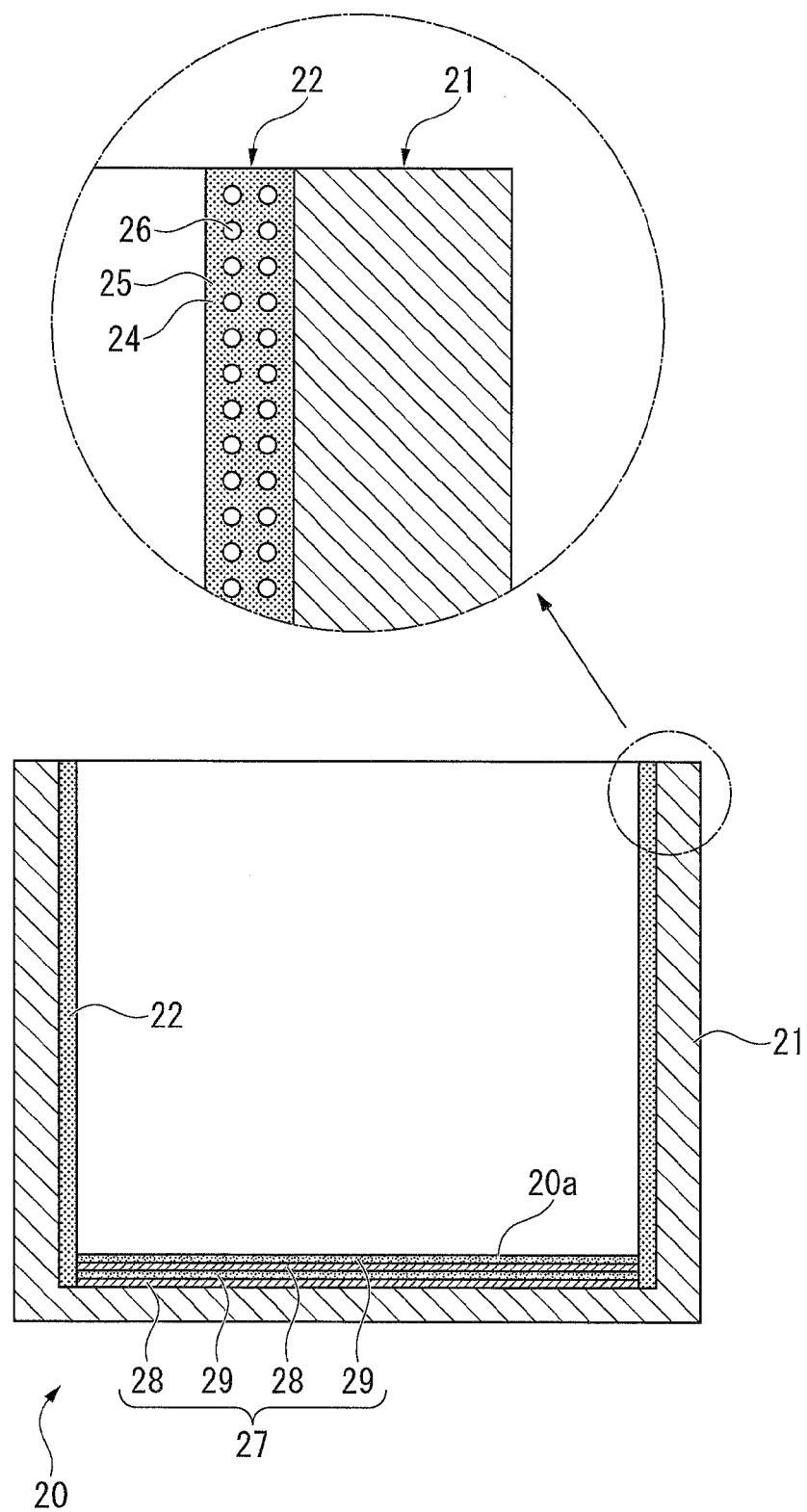
FIG. 4 is a schematic view illustrating a crucible, which is used in the polycrystalline silicon ingot manufacturing apparatus shown in FIG. 3.
Figure 5:
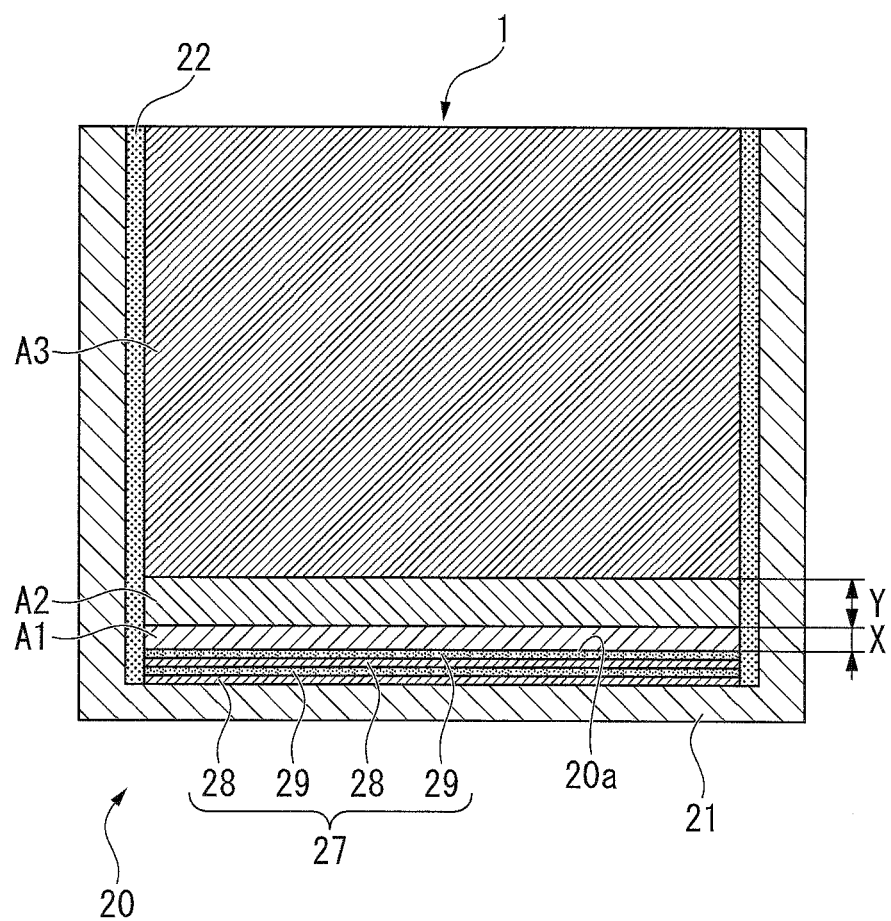
FIG. 5 is a schematic view illustrating the degree of solidification of a silicon melt in the crucible shown in FIG. 4.

The crucible 20 includes, as shown in FIG. 4, a crucible body 21 made of silica; a Si$_3$N$_4$ coating layer 22 formed on a side wall (inside) of the crucible body 21; and a multilayered silica coating layer 27 formed on a bottom 20a of the crucible body 21, The Si$_3$N$_4$ coating layer 22 is composed of, as shown in FIG. 4, fine fused silica sand 26 sized in 50 to 300 μm dispersed in a mixed base material of a Si$_3$N$_4$ powder 24 sized in 0.2 to 4.0 μm and silica 25 containing 10 to 6,000 ppm of sodium. The mixed base material of the Si$_3$N$_4$ powder 24 and the sodium-containing silica 25 is disposed (exposed) on the top surface of the Si$_3$N$_4$ coating layer 22.

The multilayered silica coating layer 27 is formed in a multilayered structure composed by depositing a slurry layer 28 and a stucco layer 29 on top of each other. The multilayered silica coating layer 27 may be composed of 3 layers or more and 4 layers or less in total of the slurry layer 28 and the stucco layer 29, in which the slurry layer 28 may be formed by coating a slurry obtained by mixing a filler with a particle size of 10 μm or more and 50 μm or less with an aqueous dispersion of colloidal silica, and the stucco layer 29 may be formed by scattering (dusting with) grain silica with a particle size of 0.3 mm or more and 3 mm or less thereon.

Also, thermocouples (not shown) to monitor the height of the solidification interface are installed on the side of the crucible 20.

The method for manufacturing a polycrystalline silicon ingot 1 according to the present embodiment will be described below. This embodiment includes casting the polycrystalline silicon ingot 1 using the above-mentioned polycrystalline silicon ingot manufacturing apparatus 10.

First, a silicon material is charged into the crucible 20 having the Si$_3$N$_4$ coating layer 22 formed on the side, wall (inside) and the multilayered silica coating layer 27 formed at the bottom, in which as the silicon material, a bulk material, referred to as a "chunk" obtained by pulverizing 11N (which means 11 nines; purity level of 99.999999999) high-pure silicon, may be used. The bulk silicon material has a particle size of, for example, 30 mm to 100 mm.

The silicon material is heated by applying the current to the ceiling heater 14 and the underfloor heater 13. This leads to the silicon melt L contained in the crucible 20.

Next, the current to the underfloor heater 13 is shutdown before Ar gas is fed into the inside of chill plate 12 through the feed pipe 16. This works to cool the bottom of the crucible 20. In addition, as the current to the ceiling heater 14 is reduced gradually, the silicon melt L in the crucible 20 is cooled from the bottom of the crucible 20 and unidirectionally solidified upwardly from the bottom, During the period, the amount of Ar gas fed into the chill plate 12 and the current applied to the ceiling heater 14 may be controlled to adjust the solidification rate of the silicon melt L in the crucible 20, that is, its upward migration rate through the solid-liquid interface.

Further, in the present embodiment, the degree of solidification of the silicon melt L in the crucible 20 is divided into three zones to set the solidification rate for each region, respectively.

More specifically, the degree of solidification of the silicon melt L in the crucible 20 is divided into a first zone A1 from 0 mm to X in height, a second zone A2 from X to Y in height and a third zone A3 of Y or more in height, based on the bottom 20a of the crucible 20, wherein the height X is set in the range of 10 mm≤X<30 mm and the height Y is set in the range of 30 mm≤Y<100 mm. In addition, the height Y−X in the second zone A2 is set in the range of 10 mm≤Y−X≤40 mm.

In the present embodiment, X=20 mm, Y=40 mm and the height Y−X in the second zone A2 is set to 20 mm.

The solidification rate for each region is set as follows: a solidification rate V1 in the first zone A1 is set in the range of 10 mm/h≤V1>20 mm/h. A solidification rate V2 in the second zone A2 is set in the range of 1 mm/h≤V2≤5 mm/h. A solidification rate V1 in the third zone A3 is set in the range of 5 mm/h≤V1≤30 mm/h.

Figure 6:
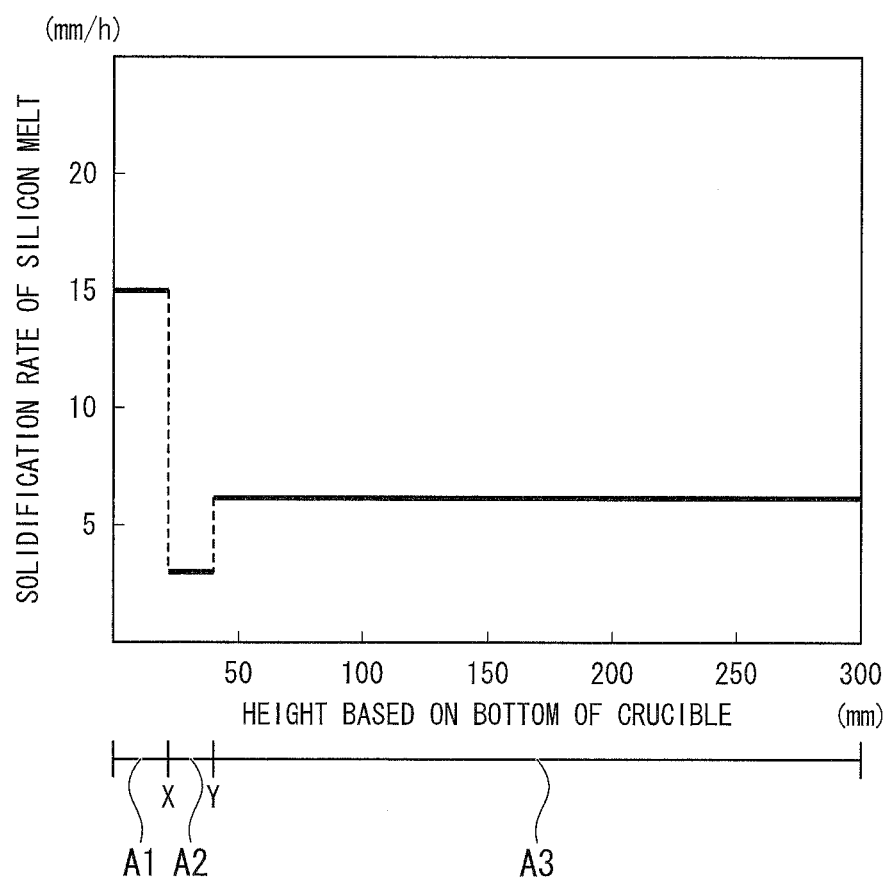
FIG. 6 is a graph illustrating various patterns of settings of a solidification rate applicable to the method for manufacturing a polycrystalline silicon ingot according to an embodiment of the present invention.

More specifically, as shown in FIG. 6, the solidification rate V1 in the first zone A1 from the bottom to 20 mm in height is set to 15 mm/h, the solidification rate V2 in the second zone A2 from 20 mm to 40 mm in height is set to 3 mm/h, and the solidification rate V3 in the third zone A3 from 40 mm to 300 mm high is set to 5.8 mm/h. The average solidification rate through the entire polycrystalline silicon ingot 1 is 6.5 mm/h.

During the unidirectional solidification, the solid-liquid interface of the silicon in the crucible is even. The height of the solid-liquid interface of the silicon on the basis of the bottom of the crucible is monitored by the thermocouples mounted on the side wall of the crucible.

Thus, the polycrystalline silicon ingot 1 in a quadrangular prism shown in FIG. 1 is formed by the unidirectional solidification method.

For the method for manufacturing the polycrystalline silicon ingot 1 and the polycrystalline silicon ingot according to the present embodiment 1, both of which have the components abovementioned, the degree of solidification in the crucible 20 is divided into a first zone A1 from 0 mm to X in height, a second zone A2 from X to Y in height and a third zone A3 of Y or more in height, based on the bottom 20a of the crucible 20, to set the solidification rate for each region, respectively.

Herein, in the present embodiment, since the crucible 20 has the $Si_3N_4$ coating layer 22 formed on its side wall (inside) and the multilayered silica coating layer 27 formed at its bottom 20a, at the bottom 20a of the crucible 20 to be the starting point of solidification, silica which gets chemically wet with the silicon melt L, i.e., which is highly wettable with the silicon melt L, may be exposed to facilitate a creation of crystal nucleus. Therefore, the solidification rate V1 in the first zone A1 from 0 mm to X in height may be set in the range of 10 mm/h≤V1≤20 mm/h to relatively increase the rate to be allowed to create a lot of crystal groups with random crystal orientation starting from the nucleus.

The solidification rate V2 in the second zone A2 is set in the range of 1 mm/h≤V2≤5 mm/h to relatively slow it to selectivity grow the crystal groups with random crystal orientation so that the crystals facing to the preferred growth orientation grow predominantly. Thereby, the polycrystalline silicon ingot 1 composed of a large column crystal with unidirectional crystal orientation may be cast. Herein, since the preferred growth orientation of silicon is the (001) and/or (111) direction(s), there may be more crystals facing in the direction(s) as the column crystal as shown in FIG. 2 so that the conversion efficiency of the solar cells may be improved.

On the other hand, the solidification rate V1 in the first zone A1 is set in the range of 10 mm/h≤V1≤20 mm/h to relatively increase the rate to rapidly form a solid phase at the bottom 20a of the crucible 20. Thereby, this permits the oxygen incorporation into the silicon melt L from the bottom 20a of the crucible 20 to control. Additionally, the height X of the first zone A1 may be set in the range of 10 mm≤X<30 mm, particularly in the present embodiment, X=20 mm to make sure to control the oxygen incorporation into the silicon melt L from the bottom 20a of the crucible 20.

Moreover, the solidification rate V2 in the second zone A2 may be set in the range of 1 mm/h≤V2≤5 mm/h to relatively slow it to release oxygen in the silicon melt L in the second zone A2 from its liquid level. Thereby, this may result in a significant decrease in the oxygen content in the silicon melt L. Each height Y in the first zone A1 and the second zone A2 may be set in the range of 30 mm≤Y<100 mm, respectively, particularly in the present embodiment, Y=40 mm, to make it possible to shorten the length of the portion having the higher oxygen content to significantly improve the production yield of the finished product polycrystalline silicon.

However, less than 10 mm/h of the solidification rate V1 may cause an inadequate creation of the crystal nucleus to fail to create so many crystal groups with random crystal orientation. Furthermore, more than 20 mm/h of the solidification rate V1 may fail to reduce the height X in the first zone. Thus, the solidification rate V1 in the first area A1 is set in the range of 10≤V1≤20 mm/h.

Less than 1 mm/h of the solidification rate V2 may lead to remelting of the solid phase. Conversely, more than 5 mm/h of the solidification rate V2 may fail to selectivity grow the crystals and to release the oxygen well. Thus, the solidification rate in the second zone V2 is set in the range of 1 mm/h≤V2≤5 mm/h.

Moreover, the height Y−X in the second zone A2 is set in the range of 10 mm≤Y−X≤40 mm, particularly in the present embodiment, Y−X=20 mm, so that it may have enough time to selectivity grow the crystals and enough time to release oxygen in the silicon melt externally. Thereby, this may lead to selective growth of the crystals facing to the preferred growth orientation and also ensure a decrease in the oxygen content of the polycrystalline silicon ingot.

The solidification rate V3 in the third zone A3 may be set in the range of 5 mm/h≤V3≤30 mm/h, particularly in the present embodiment, V3=5.9 mm to make it possible to keep the production efficiency of the polycrystalline silicon ingot, as well as to smoothly proceed with the unidirectionally solidification.

On the bottom of the crucible 20, a multilayered silica coating layer 27 obtained by disposing the slurry layer 28 formed by coating the silica-containing slurry and the stucco layer 29 stuccoed (dusted) with grain silica on top of each other may be formed to prevent the bottom of the polycrystalline silicon ingot 1 from cracking.

Moreover, in the polycrystalline silicon ingot 1 of the present embodiment, the crystal growth orientation in a horizontal cross-section of a portion which is located 40 mm above its bottom portion in contact with the bottom of the crucible 20 is measure by an EBSD method to determine distribution of crystal orientation within a stereographic triangle of which apexes are at (001), (101) and (111); the stereographic triangle is then divided into three regions: the zone on the side of (001), the zone on the side of (101) and the zone on the side of (111) along the lines connecting each of center points between apexes to the gravity point of the stereographic triangle; and the distribution of crystal orientation comprised in each region is represented by a relative intensity ratio from the corresponding electron diffraction pattern to result in 10% or less of the percentage of the distribution of crystal orientation distributed in the region on the side of (101) so that it means that the crystals have been selectively grown in the zone located 40 mm above its lower surface, and therefore, the use of the portion as the solar cell substrate may result in improved conversion efficiency of the solar cell.

In addition, in the polycrystalline silicon ingot 1 of the present embodiment, the oxygen content in the center of a cross-section of the zone which is located 30 mm above its bottom portion in contact with the bottom 20a of the crucible 20 may be set to $4 \times 10^{17}$ atm/cm$^3$ or less to adequately make a finished product using the zone which is located 30 mm above its bottom portion.

While the method for manufacturing the polycrystalline silicon ingot and the polycrystalline silicon ingot according to the embodiments of the present invention have been described hereinabove, the present invention is not limiting thereto and any modifications can be made if desired.

For example, the polycrystalline silicon ingot has been described to be cast by using the polycrystalline silicon ingot manufacturing apparatus shown in FIG. 2, but it is not intended to be limited thereto, and it may be also cast by using the other type of polycrystalline silicon ingot manufacturing apparatus.

Further, the size and the shape of the polycrystalline silicon ingot are not intended to be limited to the ones described in the present embodiment, and any modifications can also be made if desired.

EXAMPLES

The results of the confirmatory experiment conducted to confirm advantageous effects of the present invention are reported below. The polycrystalline silicon ingot in size of 680 mm squares × 300 mm in height was cast by using the polycrystalline silicon ingot manufacturing apparatus described in the present embodiment.

In Inventive Example, as shown in FIG. 4, the polycrystalline silicon ingot was cast using a crucible having a $Si_3N_4$ coating layer formed on its inner face and a multilayered silica coating layer formed on the inside of its bottom, with modification of the solidification rate in the patterns described in the above-mentioned embodiment. Namely, as shown in FIG. 6, the solidification rate V1 in the first zone A1 from the bottom to 20 mm in height was set to 15 mm/h, the solidification rate V2 in the second zone A2 from 20 mm to 40 mm in height was set to 3 mm/h and the solidification rate V3 in the third zone A3 from 40 mm to 300 mm in height was set to 5.8 mm/h. In this regard, the average solidification rate through the whole of the polycrystalline silicon ingot 1 was 6.5 mm/h, and it took 52.7 hours to solidify it.

In Comparative Example, the polycrystalline silicon ingot was cast using a crucible having $Si_3N_4$ coating layers formed on the inside both of its side wall and its bottom (i.e., on the entire inside), with changes in the solidification rate in the patterns shown in FIG. 6 in the same manner as in Inventive Example.

Moreover, in the Conventional Example, the polycrystalline silicon ingot was cast at the constant solidification rate of 5.1 mm/h using the crucible having $Si_3N_4$ coating layers formed on the inside both of its side wall and its bottom (i.e., on the entire inside). It took 59 hours to solidify it.

For polycrystalline silicon ingots according to Inventive Example, the Comparative Example and the Conventional Example thus obtained, test samples in size of 5 mm×5 mm×5 mm were taken from the center of each horizontal cross-section lying on 8 zones which were located 10 mm, 25 mm, 50 mm, 100 mm, 150 mm, 200 mm, 250 mm and 290 mm above the bottoms of the polycrystalline silicon ingots, respectively, to determine the oxygen content in the silicon by infrared point spectrometer (IPS). The results of measurement are shown in FIG. 7.

Figure 9:
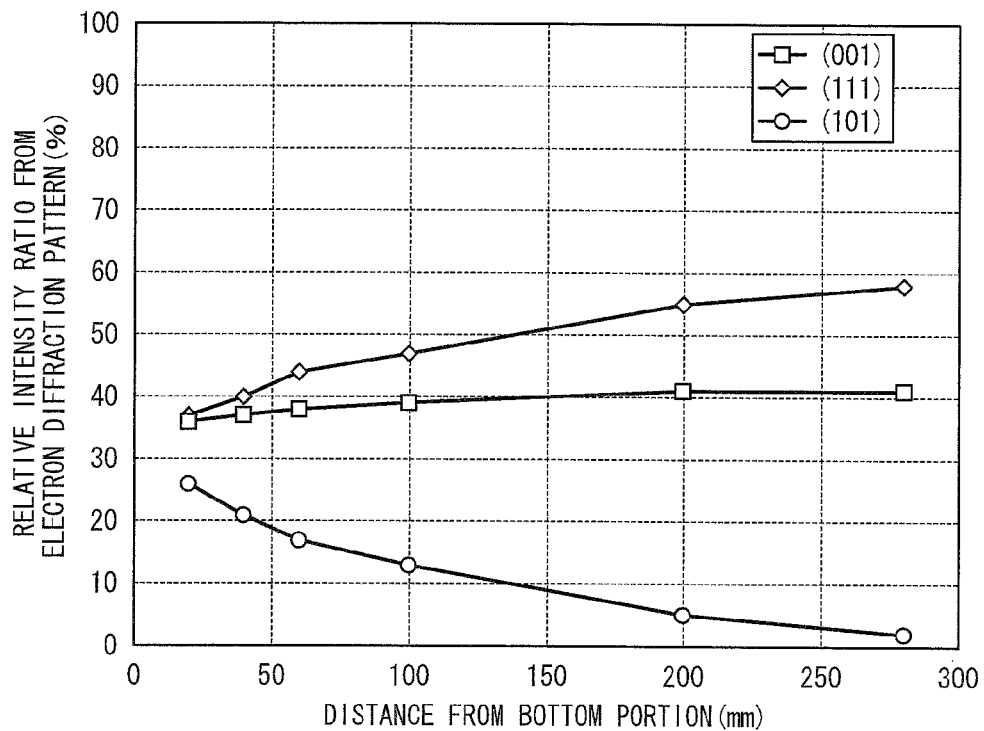
FIG. 9 is a graph illustrating distribution of crystal orientation in the polycrystalline silicon ingot according to Comparative Example in Examples, represented by a relative intensity ratio from the electron diffraction patterns.
Figure 10:
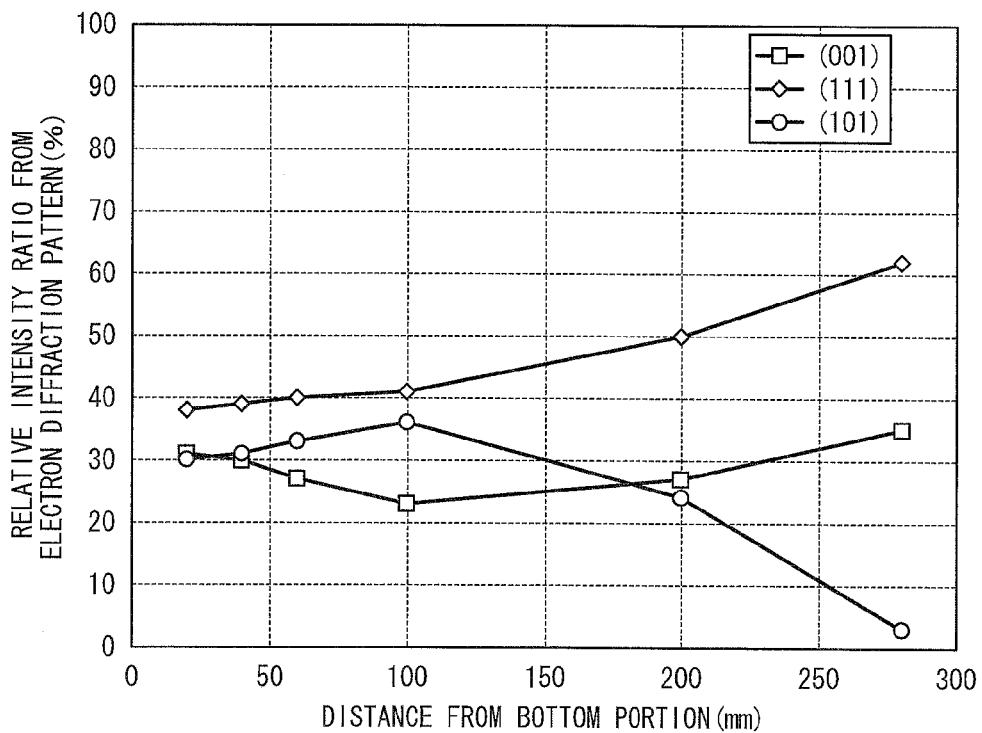
FIG. 10 is a graph illustrating distribution of crystal orientation in the polycrystalline silicon ingot according to Conventional Example in Examples, represented by a relative intensity ratio from the electron diffraction patterns.

Also, for the polycrystalline silicon ingots of the Inventive Example, the Comparative Example and the Conventional Example, test specimens in size of 5 mm×5 mm×5 mm were taken from the center of each horizontal cross-section lying on 6 zones which were located 20 mm, 40 mm, 60 mm, 100 mm, 200 mm and 280 mm above the bottoms of the polycrystalline silicon ingots, respectively, to examine the distribution of crystal orientation by an EBSD method. Next, distribution of crystal orientation within a stereographic triangle of which apexes are at (001), (111) and (101) was calculated, and then the stereographic triangle was divided into three regions: a region on the side of (001), a region on the side of (101) and a region on the side of (111) along the lines connecting each of center points between apexes to the gravity point of the stereographic triangle to obtain the distribution of crystal orientation comprised in each region represented by a relative intensity ratio from the corresponding electron diffraction pattern, respectively. The results of measurement for the Example are shown in FIG. 8; those for the Comparative Example are shown in FIG. 9; and those for the Conventional Example are shown in FIG. 10.

Figure 7:
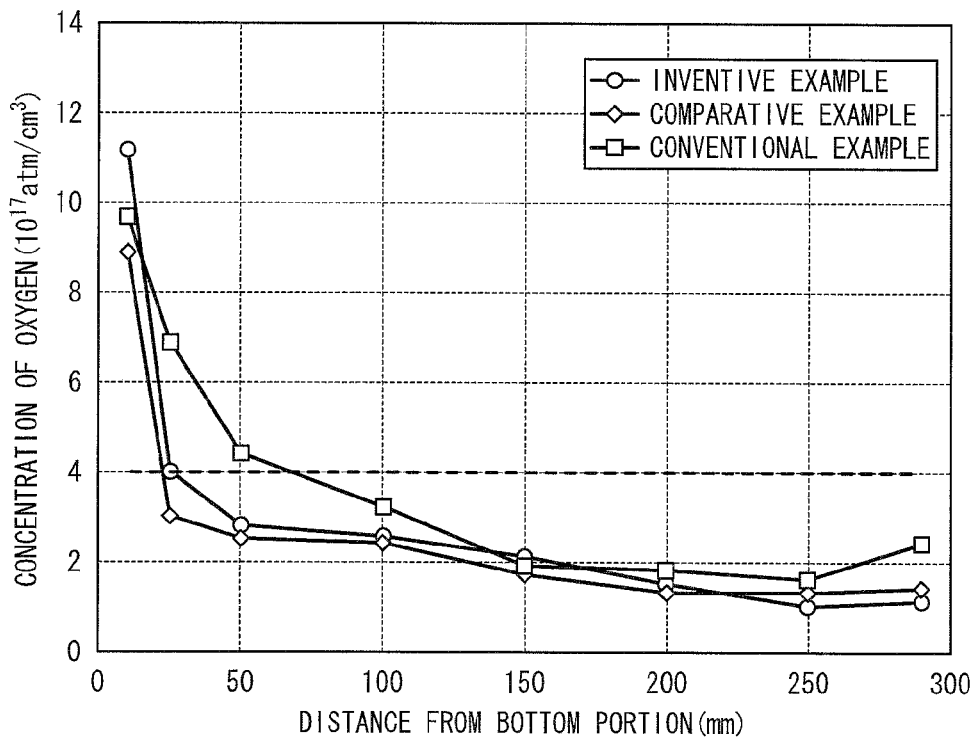
FIG. 7 is a graph illustrating the results of measurements of the oxygen content in the polycrystalline silicon ingot in Examples.

In the Conventional Example, as shown in FIG. 7, the oxygen content was found to be significantly increased in the vicinity of the bottom and more than $4 \times 10^{17}$ atm/cm$^3$ even in the zone located 50 mm above the bottom.

Further, as shown in FIG. 7, in the Conventional Example and the Inventive Example, the oxygen content thereof is lower than the oxygen content of Conventional Example, and the oxygen content was found to be increased only at a minimal portion of the bottom, wherein the oxygen content was already $4 \times 10^{17}$ atm/cm$^3$ or lees in the zone located 20 mm above the bottom.

Figure 8:
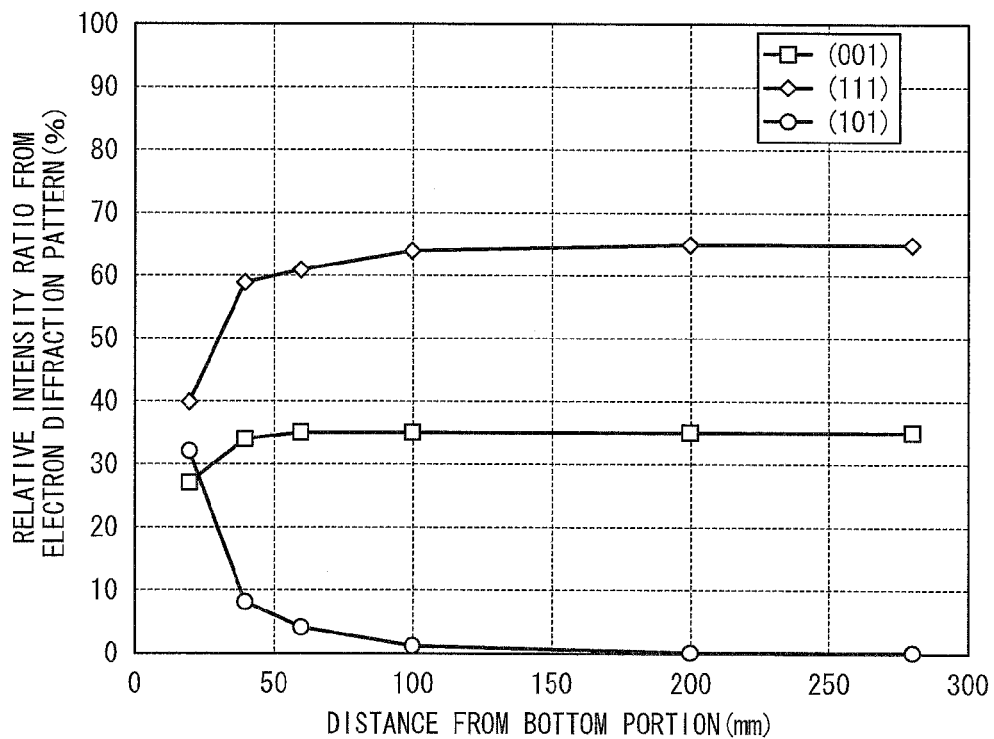
FIG. 8 is a graph illustrating distribution of crystal orientation in the polycrystalline silicon ingot according to Inventive Example in Examples, represented by a relative intensity ratio from the electron diffraction patterns.

In addition, in the Inventive Example, FIG. 8 shows that the percentage of crystals with the crystal orientation of (101) in the horizontal cross-section of the zone located 40 mm above the bottom falls in 10% or less, and that crystals grow selectively in (001) and/or (111) direction(s). Accordingly, in the Inventive Example, the crystals are considered to grow from a portion which is located 40 mm above the bottom to face in the (001) and/or (111) direction(s).

In contrast, in the Conventional Example, FIG. 9 shows that the percentage of crystals with the (101) crystal orientation tends to gradually decrease with increasing distance from the bottom, and that nevertheless, the percentage of crystals with the (101) crystal orientation is more than 10% even in the zone located 100 mm above the bottom. Accordingly, when using the zone located up to 100 mm above the bottom as the solar cell substrate, this may lead to a decrease in the conversion efficiency of the solar cell.

Furthermore, in the Conventional Example, as shown in FIG. 10, it was found that the percentage of crystals with the (101) crystal orientation was more than 20% even in the zone located 200 mm above the bottom not to control the growth orientation of the crystals at all.

In the light of that, according to the present invention, it was concluded that the polycrystalline silicon ingot having more crystals facing to the preferred crystal orientation (001) and/or (111) and the reduced area with the higher oxygen content at its bottom could be cast.

INDUSTRIAL APPLICABILITY

A high-quality polycrystalline silicon ingot may be provided by decreasing the areas having the higher oxygen content at the bottom of the polycrystalline silicon ingot.

REFERENCE SIGNS LIST

1 Polycrystalline silicon ingot
20 Crucible
22 $Si_3N_4$ coating layer
27 Multilayered silica coating layer

The invention claimed is:

1. A method for manufacturing a polycrystalline silicon ingot, comprising the steps of:
   providing a crucible which is made of silica;
   forming a silicon nitride coating layer on an inner surface of a side wall of the crucible;
   forming a multilayered silica coating layer on an inside bottom of the crucible by depositing a slurry layer and a stucco layer on top of each other; and
   unidirectionally solidifying a molten silicon in the crucible upwardly from the bottom of the crucible, wherein
   the slurry layer is formed by coating a slurry obtained by mixing a filler having a particle size of 10 μm or more and 50 μm or less with an aqueous dispersion of colloidal silica,
   the stucco layer is formed by scattering grain silica with a particle size of 0.3 mm or more and 3 mm or less,
   the multilayered silica coating layer is exposed at the inside bottom of the crucible,
   a degree of solidification is divided in the crucible into a first zone from 0 mm to X in height, a second zone from X to Y in height and a third zone of Y or higher, based on the bottom of the crucible,
   the height X falls in the range of 10 mm≤X<30 mm and the height Y falls in the range of 30 mm≤Y<100 mm, and
   a solidification rate V1 in the first zone is set in the range of 10 mm/h≤V1≤20 mm/h and a solidification rate V2 in the second zone is set in the range of 1 mm/h≤V2≤5 mm/h.

2. The method for manufacturing a polycrystalline silicon ingot according to claim 1, wherein a height Y−X in the second zone is set in the range of 10 mm≤Y−X≤40 mm.

3. The method for manufacturing a polycrystalline silicon ingot according to claim 1, wherein a solidification rate V3 in the third zone is set in the range of 5 mm/h≤V3≤30 mm/h.

4. The method for manufacturing a polycrystalline silicon ingot according to claim 2, wherein a solidification rate V3 in the third zone is set in the range of 5 mm/h≤V3≤30 mm/h.

5. The method for manufacturing a polycrystalline silicon ingot according to claim 1, wherein the multilayered silica coating layer exposed at the inside bottom of the crucible facilitates the creation of a crystal nucleus.

6. The method for manufacturing a polycrystalline silicon ingot according to claim 5, wherein in the first zone, there are created a large number of crystal groups with random crystal orientation starting from the crystal nucleus.

7. The method for manufacturing a polycrystalline silicon ingot according to claim 6, wherein in the second zone, crystals having (001) and (111) directions of a crystal orientation selectively grow from the crystal groups with random crystal orientation.

8. The method for manufacturing a polycrystalline silicon ingot according to claim 1, wherein
   the polycrystalline silicon ingot is formed by the unidirectionally solidifying step, and
   a region ratio of a side of (101) is 10% or less in a distribution of a crystal orientation within a stereographic triangle of which apexes are at (001), (101) and (111) at a horizontal cross-section of a portion which is located 40 mm above a bottom portion of the polycrystalline silicon ingot.

* * * * *